United States Patent [19]

Rau et al.

[11] Patent Number: 4,521,874
[45] Date of Patent: Jun. 4, 1985

[54] RANDOM ACCESS MEMORY DEVICE

[75] Inventors: Bantwal R. Rau, Los Gatos; Christopher D. Glaeser, Fremont; Philip J. Kuekes, Berkeley, all of Calif.

[73] Assignee: TRW Inc., Redondo Beach, Calif.

[21] Appl. No.: 425,797

[22] Filed: Sep. 28, 1982

[51] Int. Cl.³ ............................................. G11C 13/00
[52] U.S. Cl. ................................................... 365/221
[58] Field of Search ........................ 365/200, 221, 189

[56] References Cited

U.S. PATENT DOCUMENTS

| | | | |
|---|---|---|---|
| 4,365,318 | 12/1982 | Aichelmann, Jr. et al. | 365/200 |
| 4,394,753 | 7/1983 | Penzel | 365/200 |
| 4,426,688 | 1/1984 | Moxley | 365/200 |

Primary Examiner—Terrell W. Fears
Attorney, Agent, or Firm—Noel F. Heal

[57] ABSTRACT

A memory circuit in which data words are held in a continuous sequence of locations, a new data word being insertable at a selected address, and a stored data word being readable from a selected address. On data word insertion, the selected location is first vacated by shifting data already stored above or below the selected address by one location. For example, all the data in locations having addresses equal to or greater than the selected address are shifted. Data read from the circuit may be optionally purged from the device and remaining data words are then shifted to fill the location vacated by the purged data. By appropriate selection of the various modes of operation, the memory circuit may be made to operate as a first-in-first-out memory, a last-in-first-out memory, or as a conventional random access memory. The circuit is well suited for use in a computer of the horizontal type, in which the use of computing resources has to be optimally scheduled, and data flowing between the resources has to be subjected to scheduled time delays.

19 Claims, 28 Drawing Figures

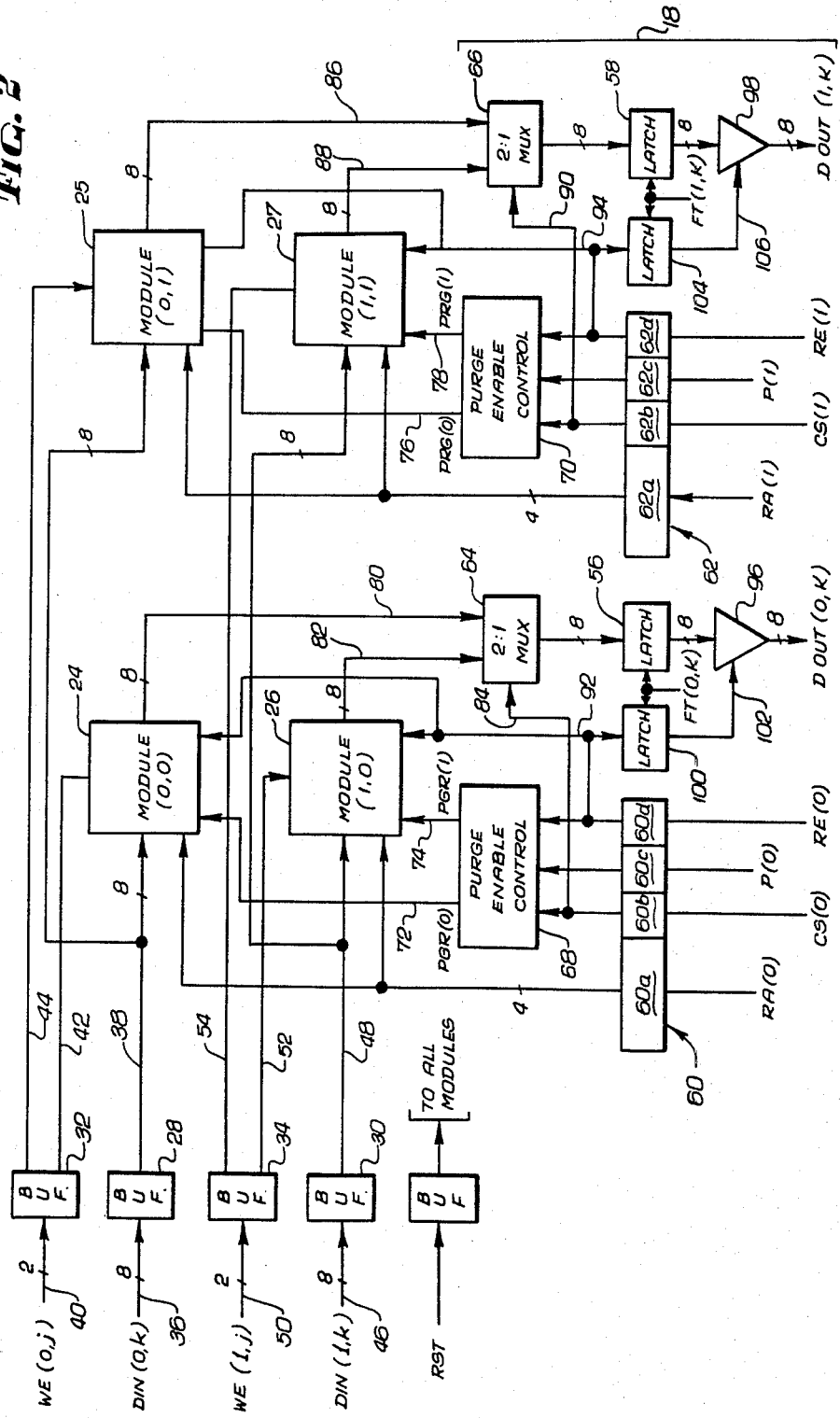

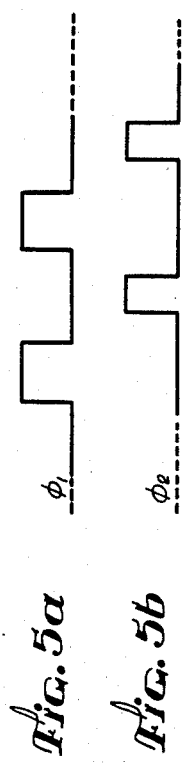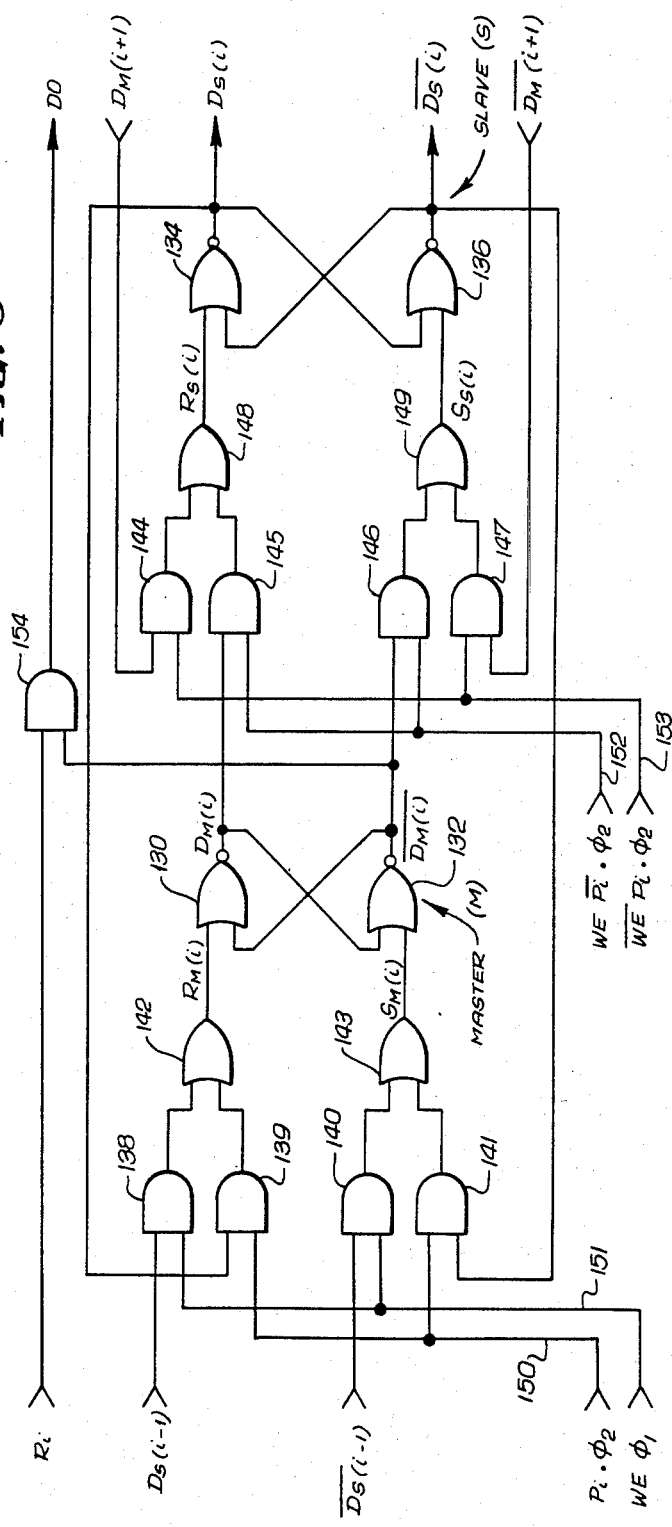
Fig. 5a
Fig. 5b
Fig. 6

Fig. 7

| | WE | $R_i$ | $P_i$ | $\phi$ | ACTION | DESCRIPTION |
|---|---|---|---|---|---|---|
| A | 0 | 1 | 0 | $\phi_1$ | M → S → DATA OUT | DATA AVAILABLE FOR READ FROM MASTER. (NO ACTION ON $\phi_2$) |
| B | 0 | 1 | 1 | $\phi_1$ | ← M ← S ← , DATA OUT | DATA AVAILABLE FOR READ FROM MASTER. DATA COPIED INTO SLAVE FROM NEXT WORD UP |
| C | 0 | 1 | 1 | $\phi_2$ | M ← S | SLAVE COPIED INTO MASTER; TO PURGE |
| D | 0 | 0 | 1 | $\phi_1$ | ← M ← S ← | DATA COPIED INTO SLAVE FROM NEXT WORD UP |
| E | 0 | 0 | 1 | $\phi_2$ | M ← S | SLAVE COPIED INTO MASTER; TO PURGE |
| F | 1 | 0 | 0 | $\phi_1$ | → M S → | DATA COPIED INTO MASTER FROM NEXT WORD DOWN. (FROM INPUT IF WORD 0) |
| G | 1 | 0 | 0 | $\phi_2$ | M → S | MASTER COPIED INTO SLAVE; TO COMPLETE UP-SHIFT. |
| H | 1 | 1 | 0 | $\phi_1$ | → M S → , DATA OUT | DATA COPIED INTO MASTER FROM NEXT WORD DOWN, AND AVAILABLE FOR READ FROM MASTER |
| I | 1 | 1 | 0 | $\phi_2$ | M → S | MASTER COPIED INTO SLAVE; TO COMPLETE WRITE |
| J | 1 | 1 | 1 | $\phi_1$ | → M S → , DATA OUT | DATA COPIED INTO MASTER FROM NEXT WORD DOWN, AND AVAILABLE FOR READ FROM MASTER |
| K | 1 | 1 | 1 | $\phi_2$ | M ← S | SLAVE COPIED INTO MASTER, LEAVING MASTER AND SLAVE UNCHANGED |
| L | 0 | 0 | 0 | — | (NO ACTION) | |

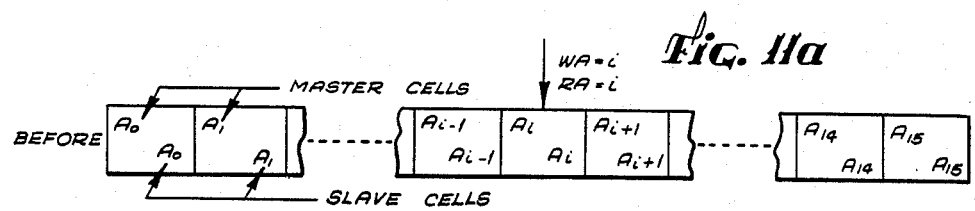
Fig. 10a  Fig. 10b  Fig. 10c
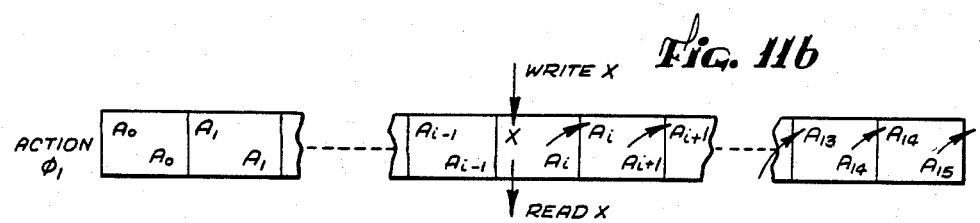
Fig. 11a
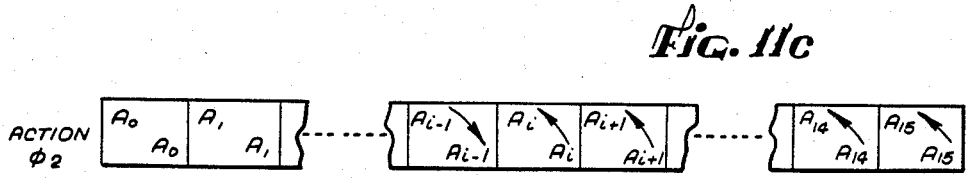
Fig. 11b
Fig. 11c

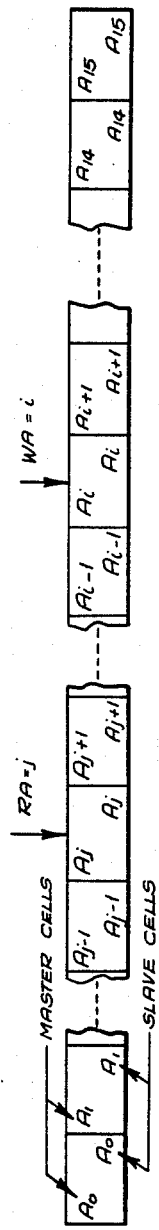
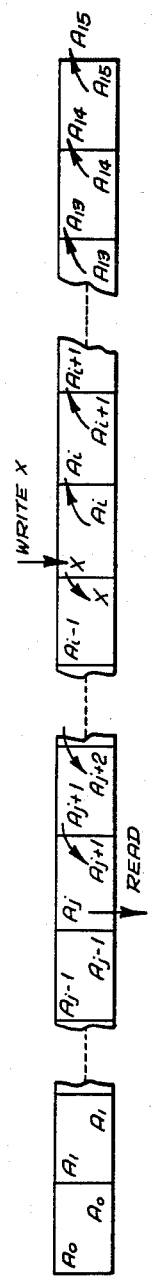
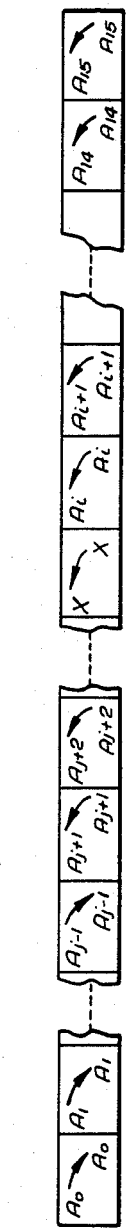
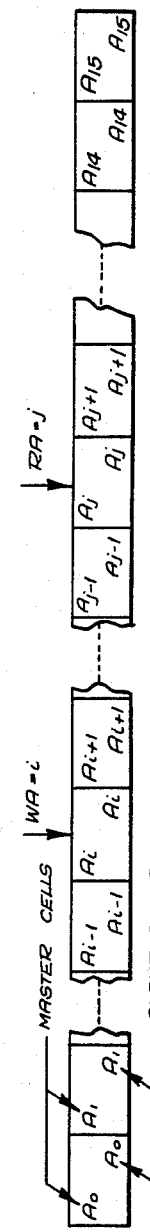
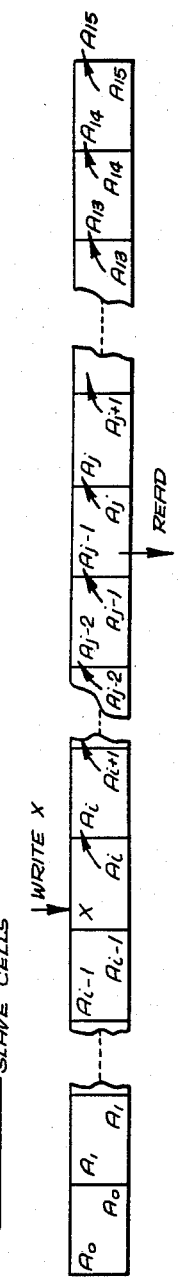
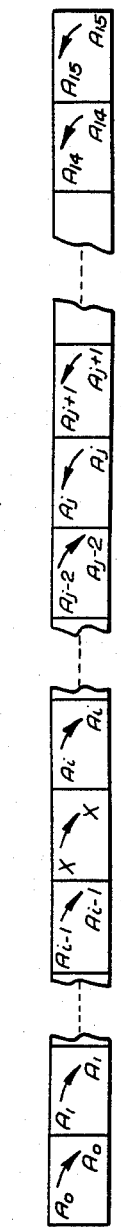
Fig. 12a BEFORE
Fig. 12b ACTION φ1
Fig. 12c ACTION φ2
Fig. 13a BEFORE
Fig. 13b ACTION φ1
Fig. 13c ACTION φ2

Fig. 16
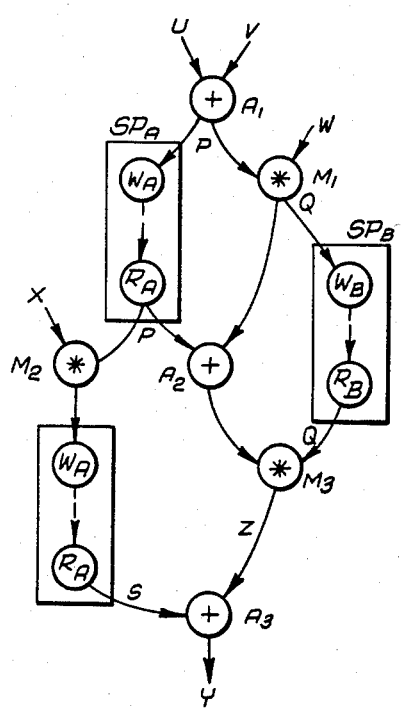
Fig. 18
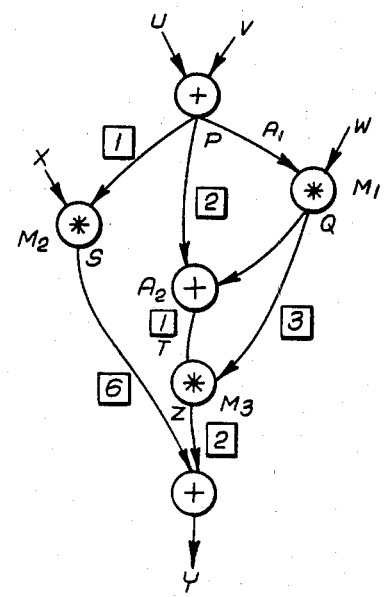
Fig. 17
| TIME | TIME (MODULO 3) | ADDER | MULTIPLIER | $SP_A$ | | $SP_B$ | |
|---|---|---|---|---|---|---|---|
| | | | | R | W | R | W |
| 0 | 0 | $A_1$ | | | | | |
| 1 | 1 | | | | | | |
| 2 | 2 | | $M_1$ | | P | | |
| 3 | 0 | | | P | | | |
| 4 | 1 | $A_2$ | $M_2$ | | | | Q |
| 5 | 2 | | | | Q | | |
| 6 | 0 | | $M_3$ | | S | | |
| 7 | 1 | | | S | | | |
| 8 | 2 | $A_3$ | | | | | |

RANDOM ACCESS MEMORY DEVICE

BACKGROUND OF THE INVENTION

This invention relates generally to random access memory circuits, and, more particularly, to random access memory circuits for use in high-speed computers employing a parallel processing architecture, or employing concurrent processing techniques usually referred to as pipelining. Although there may be other practical uses for the memory device of the invention, it will be described here in relation to its application in parallel and concurrent processors.

Modern parallel processors have a number of processing elements, such as arithmetic multipliers and adders, which can operate simultaneously. Such computers are useful in addressing certain classes of computational problems, for the most part in scientific applications, which could not be solved fast enough using a more conventional serial processor, in which each arithmetic or logical operation had to be performed. A serial computer is typically controlled by a program of which each instruction is stored in a single "word" of memory. Since there is only one processing element in a serial computer, it is logical to store a program in this manner. The computer retrieves the program word-by-word and thus executes the program of instructions.

By way of contrast, the parallel processor in general can handle at one time as many instructions as there are processing elements. The instructions are usually stored and retrieved in a single, relatively wide word. Hence the term "horizontal" processor. It can readily be understood that, depending on the complexity of the computational problem to be addressed, the preparation of an efficient program for such a computer may be a very difficult task. For a serial computer, programming is relatively straightforward, since there is only one processing element to be concerned about. For the horizontal processor, the programmer's goal is not only to program the necessary steps to arrive at a desired arithmetic result, but to do so with the most efficient utilization of the parallel nature of the processing elements.

Complicating the programming task is the nature of the computational problem, which is generally not completely parallel. For example, the output from an adder may be one of two input quantities to be multiplied in a multiplier circuit, but the other required input to the multiplier may have to be derived from the adder output by first adding to it an additional quantity. Thus the first multiplier input must be stored until the second is also available. In the past, such temporary storage was provided by "scratchpad" memory devices. In this simple example, the first available input to the multiplier would be stored in a scratchpad memory, then later retrieved when the second input was available and the multiplier was also available.

Basically, then, the task of programming a horizontal processor is one of scheduling the times of operation of the available computer resources, to make the best use of those resources in a parallel manner. The computer includes not only the resources or processing elements, but an interconnection circuit, by means of which outputs from selected processing elements can be connected as inputs to other selected processing elements. When an output has to be temporarily stored in a scratchpad memory, the memory is, in effect, another computer resource, the use of which has to be scheduled by the programmer. Unfortunately, there is a large class of scientific computations for which these scheduling steps are not only non-trivial, but can be performed only on a time-consuming trial-and-error basis.

The class of computations referred to is that involving iterative techniques. Iterative computations, in which an identical computational loop is repeated many times to obtain a result, account for a major fraction of the execution time in scientific computations. Scheduling iterative computations for parallel processors is, therefore, of considerable importance. Subject to data dependencies between them, successive iterations can be scheduled in any manner that does not result in conflict for the use of the resources. One way of overlapping iterations is to use identical schedules for successive iterations, and to initiate successive iterations spaced by a fixed interval, referred to as the initiation interval.

The minimum initiation interval is the smallest initiation interval for which a schedule without conflicts can be formulated. Use of the minimum initiation interval results in optimum utilization of the computer resources. An optimum schedule can be arrived at only if the minimum initiation interval is known. This interval will depend in part on the usage that is made of scratchpad memories, since these are also computer resources. But the scratchpad usage can only be determined when a schedule is known. In practice, the apparent circularity of this problem is avoided by trial and error. The programmer selects a likely candidate for the minimum initiation interval and tries to formulate a schedule with no conflicts for the usage of resources. If a schedule cannot be found, the programmer may either keep trying, or may increase the estimated minimum initiation interval and try again, bearing in mind that a schedule using the increased interval will not be as efficient.

An important consequence of these scheduling difficulties is the lack of availability of an efficient compiler for horizontal machines. A compiler is a computer program whose only function is to translate a program written in a higher-level programming language into instructions in "machine language" for execution by a particular machine. The higher-level language is designed to be easily understood by scientists or engineers who might use it, and it requires no detailed knowledge of the machine that will be used ultimately to execute the program. In the case of horizontal machines, a compiler should be capable of performing the function of scheduling the activities of the computer resources for optimum parallel utilization. Since the scheduling task, as already discussed, has been accomplished by trial-and-error methods, an efficient compiler to achieve the same result has proved to be an elusive goal.

An important factor in efficient scheduling of operations on horizontal machines, or on machines employing pipelining principles, is the manner in which memory used for temporary storage is organized. A conventional random access register file, such as might be used for a scratchpad memory, allows writing into a specified address and reading from a specified address. Although this arrangement would seem to provide the ultimate in programming flexibility, in fact it poses a serious limitation to the production of efficient machine-language programs. For example, suppose that quantities Q1, Q2 and Q3, derived from the first, second and third iterations of a computation, are saved temporarily in a register file locations #1, #2 and #3, respectively. At some subsequent point in the computation schedule for each iteration, the quantities will be retrieved from the register file. However, one of the efficiencies of iterative processing is sacrificed, since different iterations will need different programs to be able to decide where to store the quantity, and to "remember" where to retrieve it. If three storage locations are needed to store corresponding quantities from different iterations, then three different versions of the program will be required. For example, one version would be used for the first, fourth, seventh, and so forth, iterations, and would use location #1 as the storage and retrieval address. Since the programs employ very wide instruction words, additional copies of a program are a significant demand on available program storage facilities.

Although a shift register would provide one possible solution to this specific problem, a shift register might not meet other temporary storage requirements of a program. Other memory configurations, such as a "push-down stack," in which items are stored and retrieved at the same location, are also not suitable solutions to the problem. A push-down stack operates on a last-in-first-out basis, which is not usually an appropriate requirement for iterative computation.

It will be appreciated from the foregoing that there is still a significant need for improvement in the field of random access memory devices, especially as they might be applied to computers of the horizontal type or those employing pipelining principles. The present invention fulfills this need.

SUMMARY OF THE INVENTION

The present invention resides in a random access storage and retrieval circuit in which data words are held in a sequence of contiguous locations, a new data word being insertable at a selected location in the sequence, and a stored data word being readable from a selected location, and optionally purged from memory, the remaining stored data words then being consolidated into a single sequence of contiguous locations. Depending on the locations selected for inserting and reading data, the memory circuit can operate as a push-down stack, or for that matter a "push-up" stack, since the direction of data movement is not critical, or as a simple shift register, or in a more complex manner in which data words are inserted into the data already in memory, and may be purged from memory on reading. Another possibility is that data words may be written into the first available empty location.

Briefly, and in general terms, the memory circuit of the invention comprises a plurality of storage elements arranged in a logical sequence of contiguous locations, an insert control line, to enable writing into memory, a set of write address lines to define the location into which data is to be inserted, a read control line to enable reading from memory, a set of read address lines to define the location from which data is to be read, and a purge control line to allow optional purging of data read from the memory circuit. Importantly, the circuit includes data reading means for reading data from the specified address, data purging means for purging data from the specified address and consolidating remaining data into a single region of contiguous locations, and data insertion means for writing data into a specified location, after first shifting data to vacate the specified location and maintain the same sequence of previously stored data.

To solve the storage problem discussed in the foregoing descriptive section of this specification, at least two possible configurations of the memory circuit are suitable. First, the writing or inserting commands could be arranged by hardware to be always made into the lowest-numbered unoccupied location, and reading could always be made at location zero. The result is a first-in-first-out stack, of variable length. In this regard, it will be understood that no limitation is implied in describing the circuit as being filled starting at location zero. The circuit could operate equally well by being filled at the highest address first.

A second approach is to make all new insertions at location zero and to make all reads from a higher numbered location. This is basically a shift register, also with the desired first-in-first-out property, but with a fixed length determined by the read location. In this approach, the write address lines will always be set to zero, or maybe non-existent, and quantities already stored in higher numbered addresses will be shifted by one location on each insert operation.

It will be appreciated from the foregoing that the pesent invention represents a significant advantage in the field of random access memories. In particular, the invention provides a memory organization that is readily adaptable for operation as a first-in-first-out memory, a last-in-first-out memory, a shift register, or a random access memory in the conventional sense. As will be seen in the detailed description that follows, the invention can be used to particular advantage in high-speed computers employing horizontal architecture or pipelining principles necessitating deterministic scheduling of computer resources. Other aspects and advantages of the invention will become apparent from the detailed description, taken in conjunction with the accompanying drawings.

BRIEF DESCRIPTION OF THE DRAWINGS

FIG. 2 is a block diagram of a two-by-two crossbar interconnect circuit constructed in accordance with one embodiment of the present invention;

FIGS. 5a and 5b show the waveforms of two clocking signals used in the circuit of the invention;

FIG. 6 is a logic diagram of a single-bit storage element used in the storage module of FIG. 4;

FIG. 7 is a table showing the actions of the storage element of FIG. 6 when presented with various combinations of read, write, purge, and timing control signals;

FIGS. 10a–10c are diagrams illustrating operation of an alternate embodiment of the basic memory circuit in accordance with the invention;

FIGS. 11a–11c, 12a–12c and 13a–13c are diagrams illustrating action of the basic memory circuit of FIGS.

Figure 1:
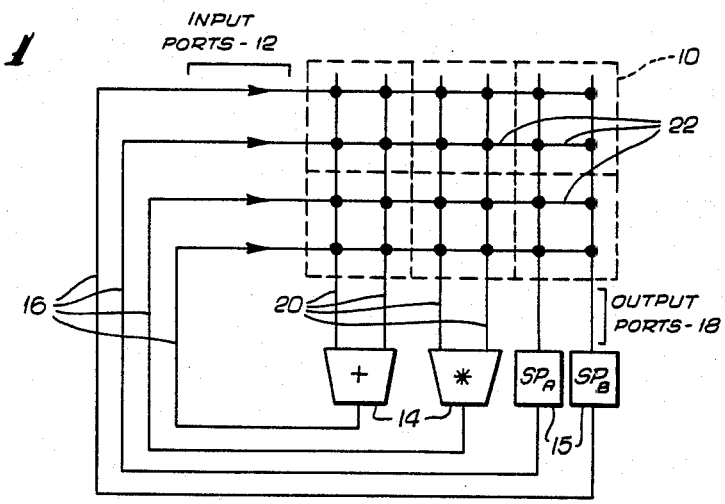
FIG. 1 is a simplified block diagram of a computer system with parallel processing elements, scratchpad memory elements, and an interconnect circuit.
Figure 4:
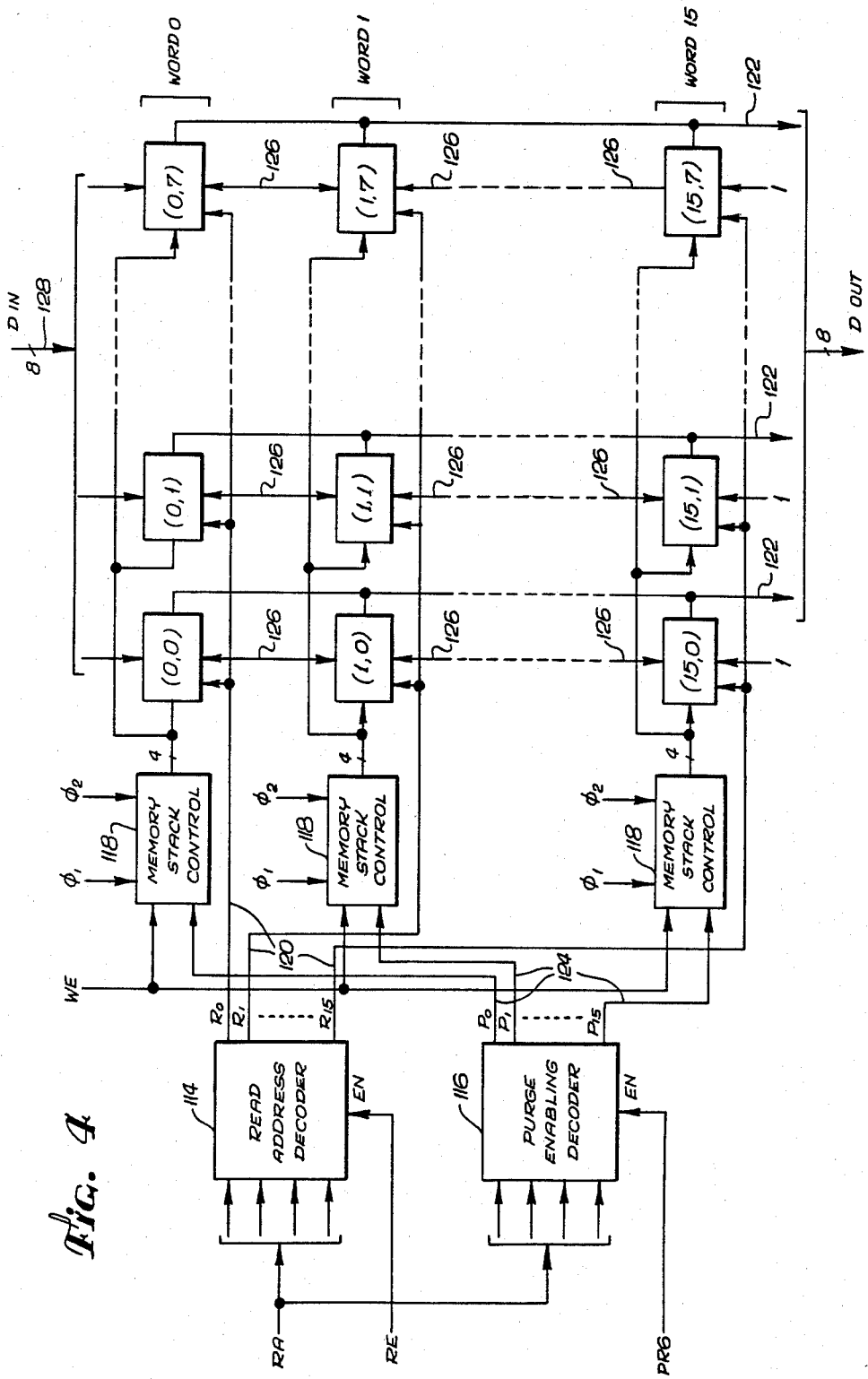
FIG. 4 is a block diagram of one of the four storage modules of the circuit of FIG. 2.
Figure 14:
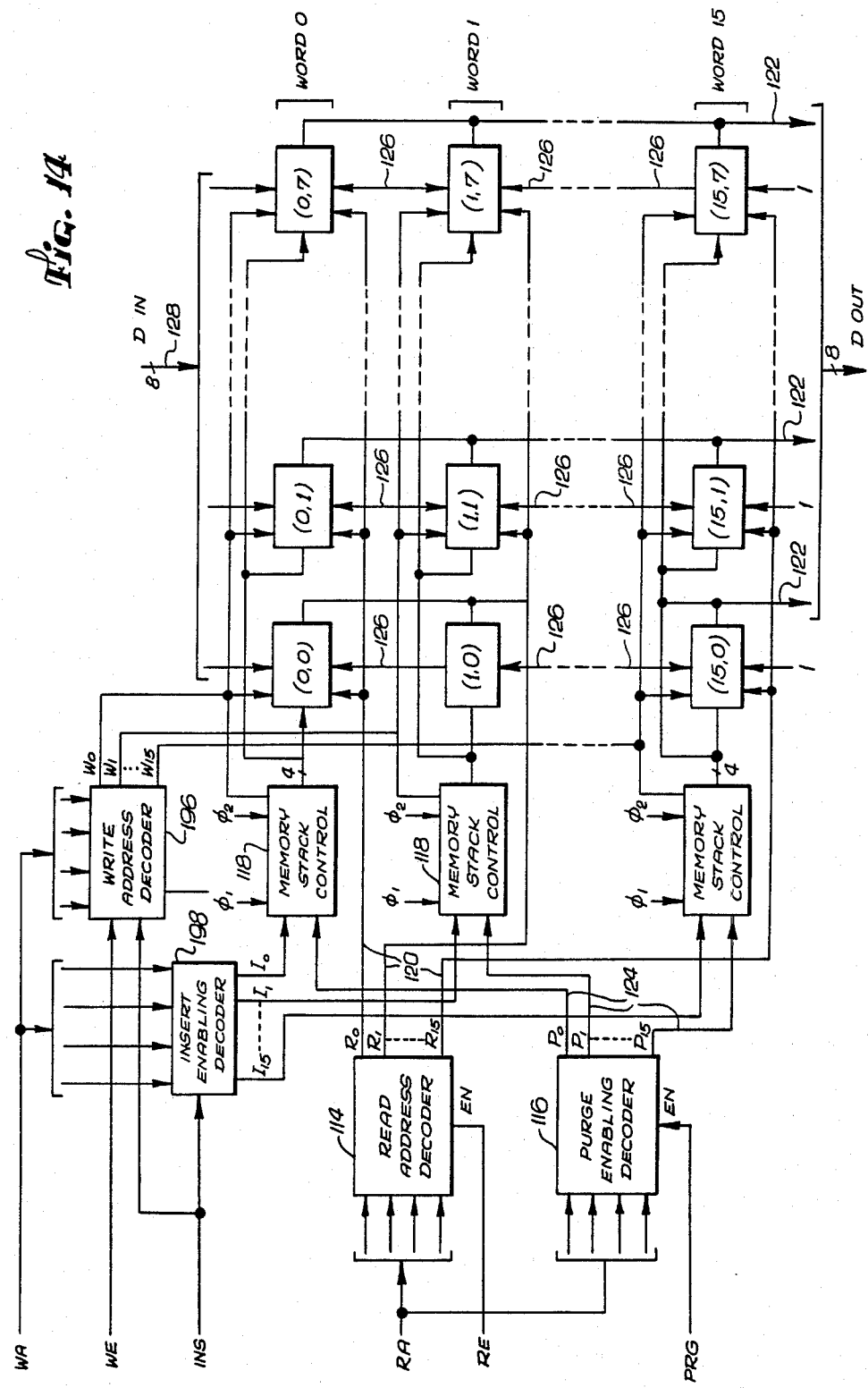
Figures 15, 19:
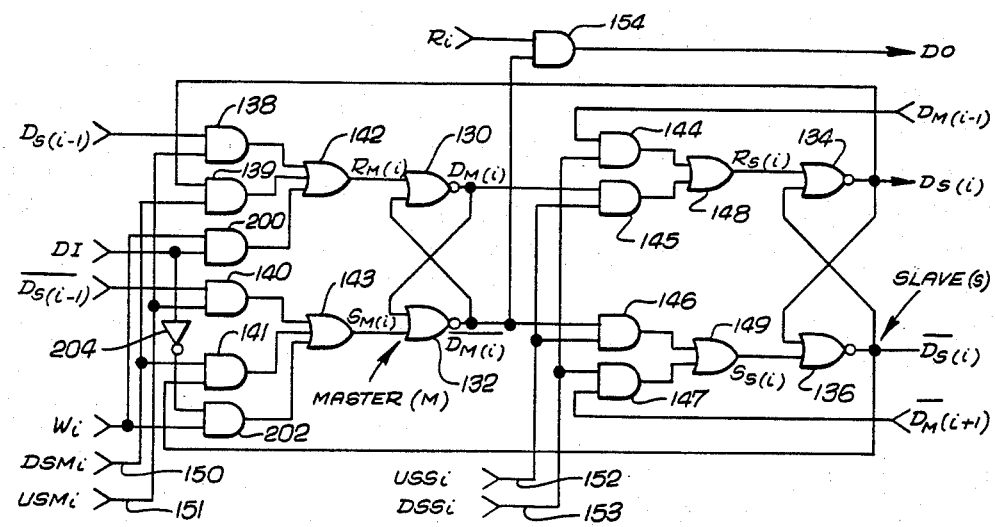

10a–10c during simultaneous reading and writing operations at the same and different locations;

FIG. 14 is a block diagram similar to FIG. 4, showing a storage module of the type shown diagrammatically in FIGS. 10a–10c, and control logic necessary to access the module;

FIG. 15 is a logic diagram similar to FIG. 6, showing a single-bit storage element used in the storage module of FIG. 14;

FIG. 16 is a directed acyclic graph of a sample computational problem for solution on a computer system of the type shown in FIG. 1;

FIG. 17 is an optimal schedule for solution of the problem of FIG. 16 using the computer system of FIG. 1;

FIG. 18 is a directed acyclic graph similar to FIG. 16, but without reference to scratchpad memories; and FIG. 19 is an optimal schedule for solution of the problem of FIG. 18 using a novel computer system with no scratchpad memories.

DESCRIPTION OF THE PREFERRED EMBODIMENT

As shown in the drawings for purposes of illustration, the present invention relates to a novel random access storage and retrieval circuit, intended principally for use in conjunction with a computer employing parallel processing elements. As will be described in further detail by reference to a specific example, in computers employing parallel processing or pipelining principles it is necessary to provide selected time delays for data flowing between the processing elements. The present invention has an important application in this area.

FIG. 1 shows in simplified form a conventional parallel processing computer system, including an interconnect circuit 10, having a plurality of input ports 12 coupled to processing elements 14 and scratchpad memory files 15, over lines 16, and a plurality of output ports 18 coupled to the processing elements and the scratchpad memory files over lines 20. As shown diagrammatically in FIG. 1, lines from the input ports 12 intersect with lines from the output ports 18, at cross-points indicated by reference numeral 22.

By way of background, FIGS. 16 and 17 show how such a computer system would be programmed to perform a specific parallel processing computation. FIG. 16 is a directed acyclic graph of the necessary computations, using a multiplier and an adder, for performing the following computation of quantity Y, where:

$$Y = X*P + (P+Q)*Q,$$

$$P = U + V$$

and $$Q = P*W.$$

As shown in the figure, this computation involves three multiplication operations, referred to as M1, M2 and M3, and three addition operations, referred to as A1, A2 and A3. It is assumed that the adder and multiplier have a cycle time of one cycle and a latency time of two cycles, i.e., each add or multiply operation will be completed two cycles after it is initiated. It will be seen from the nature of the computation that the results of some operations have to be used immediately in succeeding operations, while the results of other operations may not be required immediately and have to be stored temporarily in one of the scratchpad memory files.

The computation is an iterative one, that is it represents one complete cycle or iteration of many that have to be performed to arrive at a desired result. Another assumption is that the iterative computations involved in this example are of the type that no iteration has to run all the way to completion before the next succeeding iteration is initiated. Ideally, since each of the two available processing elements is used three times in each iteration, the elements can be utilized optimally by starting successive iterations at three-cycle spacings. This is referred to as the minimum initiation interval. A critical aspect of programming such a computer is the scheduling of computer resources to employ the minimum initiation interval, and thereby to make optimum use of the resources.

More specifically, the computation graph of FIG. 16 shows that the result P of the first addition A1 may be used immediately in multiply M1, but must be stored in a scratchpad memory file SPA for later retrieval and use in multiply M2 and addition A2. Similarly, the result of multiply M2 has to be stored temporarily before use in multiply M3, and the result of multiply M2 has to be delayed before use in the final addition A3. In this example, it is relatively easy to derive an optimal schedule using the minimum initiation interval of three cycles, and such a schedule is shown in FIG. 17. It will be seen that the result P of the first addition A1 is used immediately in multiply M1 and stored in memory SPA for one cycle. Then the quantity P is retrieved and used in A2 and M2, while the quantity Q, from multiply M1, is stored in SPB for one cycle, and retrieved for use in multiply M3. Finally, the quantity S, from multiply M2, is stored for one cycle in scratchpad SPA, and retrieved for the final addition A3, which begins eight cycles after A1.

A second iteration, identical with the first, can be initiated three cycle times after the first addition A1, and a third iteration can be initiated three cycles after that. The schedule is constructed such that there will be no conflicts for the usage of the processing elements or the scratchpad memory files, which, it will be appreciated, are also computer resources to be scheduled.

More complex computations are correspondingly more difficult to schedule. It will be seen even from this simple example that, in some instances, it may not be possible to derive a schedule using the minimum initiation interval. Scheduling is rendered difficult by the uncertainty associated with scratchpad usage. More specifically, a complete schedule cannot be drawn up until the scratchpad usage is known in detail, and yet the scratchpad usage will depend on the scheduling details. As a practical matter, programming a parallel processing computer at this level is effected by an unsatisfactory process of trial and error. If the programmer cannot define a schedule for a minimum initiation interval of three cycles, for example, he may have to increase the interval to four cycles, which facilitates the scheduling task but may not be an optimal use of the computer resources.

An important factor in efficient scheduling of operations on horizontal machines is the manner in which memory used for temporary storage is organized. As described in an earlier section of this specification, conventional memory organizations do not lend themselves to the preparation of optimum schedules.

In accordance with the invention, there is provided a random access storage and retrieval circuit in which data words are held in a sequence of contiguous locations, a new data word being insertable at a selected location in the sequence. A stored data word is readable from a selectable location, and optionally purged from memory, the remaining stored data words then being consolidated into a single sequence of contiguous locations. Depending on the locations selected for inserting and reading data, the memory circuit of the invention can operate as a push-down stack, or as a shift register, or in a more complex manner in which data words are stored in the first available memory location, or are inserted into the data already in memory, and may be purged from memory on reading.

As presently embodied, the memory circuit of the invention is incorporated into an interconnect circuit, such as the one shown at 10. There is a separate such memory circuit at each of the cross-points 22 of the interconnect 10, to provide a selected time delay between the outputs and inputs of the processing elements 14. The scratchpad memory files 15 are then not needed, and do not need to be scheduled when programming the computer. The effect of this important modification to the interconnect circuit 10 is to completely eliminate uncertainty from the scheduling process. By way of illustration, the same computational problem discussed with reference to FIGS. 16 and 17 is treated differently in FIGS. 18 and 19, which show how a horizontal computer employing the memory of the invention would be optimally scheduled.

FIG. 18 shows the computational flow in a similar manner to FIG. 16, but it will be noticed that there is no reference to scratchpad memory files in FIG. 18. The numerals in squares represent time delays in numbers of cycles. Each of these delays is effected in a memory circuit at the appropriate cross-point 22 connecting the output of one processing element to the input of the next. For example, the output quantity P from the first addition A1 is transmitted through the interconnect circuit with three different time delays: zero, for use in multiply M1; one cycle, for use in multiply M2; and two cycles, for use in addition A2. In the first iteration column of FIG. 19, the complete computational schedule is shown, ending with A3 at the eleventh cycle and including the delay paths, shown in broken lines, and the delay times, shown in squares. A second iteration begins at the third cycle, and subsequent iterations begin every three cycles.

It will be noted that, after the beginning of the fourth iteration, the multiplier and adder are both in use at every clock cycle, so that the schedule is an optimum one. More importantly, the schedule can be derived in a mechanical manner, without trial and error. The three basic steps of scheduling are to calculate the minimum initiation interval, to schedule the explicitly scheduled resources, which do not include the memories, and finally to fill in the details on the usage of implicitly scheduled delay elements in the interconnect circuit.

FIG. 2 shows a two-by-two interconnect circuit configured in accordance with a presently preferred embodiment of the invention. It comprises four modules 24–27 desginated module (i,j), where i is the row number (0 or 1) and j is the column number (0 or 1). The input ports 12 include two eight-bit data input buffers 28 and 30 and two two-bit write-enable input buffers 32 and 34. Input buffer 28 receives input data over lines 36 and transmits the input data over lines 38 to the two row-zero modules 24 and 25. Write-enable register 32 receives write-enable signals on lines 40 and transmits them over lines 42 and 44 to the modules 24 and 25, respectively. Depending on the state of these write-enable signals, the input data will be written into module 24, module 25, or both in a broadcast mode. Similarly, input buffer 30 receives input data over lines 46 and transmits it over lines 48 to the two row-one modules 26 and 27. The data are stored in these modules as determined by write-enable signals received in buffer 34 over lines 50, and transmitted to modules 26 and 27 over lines 52 and 54, respectively.

The output ports 18 (FIG. 1) include two eight-bit output latches 56 and 58, two seven-bit output control buffers 60 and 62, two multiplexers 64 and 66, and two purge enable control circuits 68 and 70. The output control buffers 60 and 62 include read address buffers 60a and 62a, and three one-bit buffers for a module selection bit 60b and 62b, a purge bit 60c and 62c, and a read-enable bit 60d and 62d. A four-bit read address is supplied to buffer 60a or 62a, as indicated by RA(0) and RA(1), a module selection bit is applied to buffer 60b or 62b as indicated by CS(0) and CS(1), a purge signal is applied to buffer 60c or 62c, as indicated by P(0) and P(1), and a read-enable signal is applied to buffer 60d or 62d, as indicated by RE(0) and RE(1).

When a reading operation is to be initiated, the read-enable signal RE is made active, the module selection signal is switched to a one or a zero to indicate which module in the column is to be read, and the read address lines RA are selectively switched to indicate the address of one of sixteen words of data storage in the selected memory module. If the data read from storage is to be purged after reading, the purge signal P is also made active. The module select signal CS, the read-enable signal RE, and the purge signal P are logically combined in the purge enable control circuitry 68 and 70, to produce module-related purge signals PRG on lines 72 and 74 to modules 24 and 26 and on lines 76 and 78 to modules 25 and 27.

Data is made available for reading from all of the modules in a column, and then selected by multiplexing. Specifically, output data from modules 24 and 26 are transmitted over lines 80 and 82 to multiplexer 64, and one set of data is there selected for output to latch 56 by means of the module selection signal CS, which is applied to the multiplexer over line 84. Similarly, output data from modules 25 and 27 is input to multiplexer 66 by lines 86 and 88, and output from the multiplexer is selected by the CS control signal applied over line 90.

The read-enable signal RE is also applied to the modules in the column to which it pertains. Thus the RE(0) signal in buffer 60d is applied over line 92 to modules 24 and 26, and the RE(1) signal from buffer 62d is applied over line 94 to modules 25 and 27.

Output data placed in the latches 56 and 58 is made available for reading through two tri-state amplifiers 96 and 98. As will be later explained, the tri-state devices facilitate connection of a plurality of two-by-two interconnects to form a larger crossbar switch. Tri-state amplifier 96 is controlled by the corresponding read-enable signal RE(0), as stored temporarily in a one-bit latch 100 and applied over line 102 to the tri-state device. Similarly, tri-state amplifier 98 is controlled by signal RE(1) as applied through latch 104 and over line 106. When a read-enable signal is active, the corresponding tri-state amplifier is controlled to present a relatively low impedance to the flow of output signals from the output registers 56 or 58.

Two output control lines, carrying control signals FT (0,K) and FT (1,K), respectively, are employed to control latches 56, 58, 100 and 104. The FT (0,K) signal controls latches 56 and 100 and the FT (1,K) signal controls latches 58 and 104.

Figure 3:
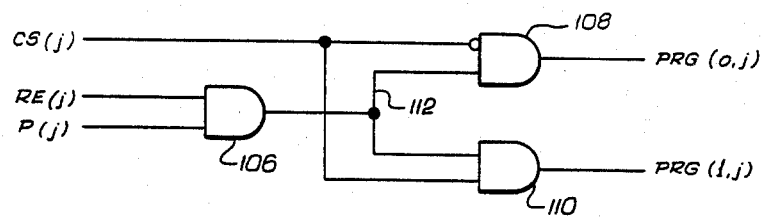
FIG. 3 is a logic diagram of purge enable control circuitry used in the circuit of FIG. 2.

The purge enable control circuitry 68 and 70 is shown in FIG. 3 to include three AND gates 106, 108 and 110. AND gate 106 receives read-enable signals RE and purge signals P as inputs, and generates an enabling output signal on line 112, which is applied as an input to AND gates 108 and 110. The module selection signal CS is applied directly to AND gate 110, and applied in inverted from to AND gate 108. AND gate 108 generates a module-related purge signal PRG if module zero is selected and the read-enable and purge signals are active. Likewise, AND gate 110 develops a module-related purge signal if module one is selected and the read-enable and purge signals are active. Use of the module-related purge signals PRG together with the read-enable and write-enable signals, will be discussed in relation to the structure of one of the modules 24–27.

Each of the modules 24–27 is identical in structure to the one shown in FIG. 4. There are sixteen storage words, designated as word-0 through word-15, each word having eight one-bit storage elements. For simplicity, the storage elements are identified by numerals (m,n), where m is the word address (from 0 to 15) and n is the bit address (from 0 to 7). For purposes of explanation, each eight-bit word of storage elements is arranged in a horizontal row.

The module also includes a read address decoder 114 and a purge enabling decoder 116, the purpose of which will shortly be explained. Each word of the module has associated with it memory stack control logic, indicated at 118. The read address decoder 114 receives as its input a four-bit read address RA, and provides as output an active signal on one of sixteen output lines 120, which carry a read signal to all eight storage elements of one of the sixteen storage words. The read address decoder 114 is enabled by a read-enable signal RE, and thus produces no output at all unless the read-enable signal RE is active. When a read signal is applied to a word location over one of the lines 120, the contents of the selected word are output to an eight-bit outputs bus 122, for input to a multiplexer such as the ones shown at 64 and 66 in FIG. 3.

The purge enabling decoder 116 also receives as its inputs the four-bit read address signals RA, together with an enabling purge signal PRG, such as the ones shown on lines 74 and 78 in FIG. 3. When a purge signal PRG is active on the enabling line to the decoder 116, this indicates that a last-read operation has been requested on a selected word of this module. After the contents of the selected word are read, they are to be replaced by the contents of the next highest numbered word, and the contents of all higher numbered words are to be effectively shifted down by one word position. To accomplish this requires the generation of a purge signal to the word containing the data being read for the last time, and to all higher numbered words in the module. The purge enabling decoder 116 performs this function, providing the required purge signals on lines 124. For example, if a last-read is requested on the word-1 location of the purge enabling decoder 116 will generate purge signals for the word-1 through word-15 locations, but not for the word-0 location.

The memory stack control logic 118 contains a number of AND gates for logically combining the purge signals on lines 124, the write-enable signals WE provided to initiate writing into the modules, and two clock signals $\phi_1$ and $\phi_2$, which are also input to the logic 118. The waveforms of the clock signals are shown in FIGS. 5a and 5b. The operation of the module in response to these clock signals and to the other control signals will be discussed in relation to a single one-bit storage element, shown in FIG. 6.

One further aspect of the element shown in FIG. 4 is that the sixteen words of storage are connected together in a series chain, as shown by the bi-directional arrows 126 between corresponding bit locations of adjacent words. As already discussed with respect to the purging operation, stored data are shifted "down," that is to a lower numbered word location after the last-read operation. During every write operation, there is a shift "up," to a higher numbered location, of all the presently stored data. The newly written data is always written into the word-0 location, as indicated by the data input lines 128 connected to the word-0 storage elements.

It will by now be apparent how the circuit can be used in different modes of operation. If a word address higher than zero is specified, retrieval of data will be subject to a delay dependent on the number of intervening write operations performed on the same module. Specific delays can be timed out, and the data than read from a word location determined from the number of intervening write operations. With appropriate connection of the purge, write-enable and read control lines, the circuit can operate as a simple crossbar switch with or without broadcast, or as a crossbar switch, with or without broadcast, with a FIFO or LIFO memory at each cross-point.

FIG. 6 shows the detailed structure of a one-bit storage element of a module, and illustrates how the read, write and purge operations are effected. Basically, each storage element comprises two interconnected flip-flops, referred to as the master flip-flop M and the slave flip-flop S. Data flow to or from the adjacent lower numbered storage element takes place only through the master flip-flop M, and data flow to or from the adjacent higher numbered storage element takes place only through the slave flip-flop S. For reading operations, output from the storage element is derived from the M flip-flop.

The logic of FIG. 6 can be best appreciated after first considering various combinations of reading and writing operations, as set forth in FIG. 7. Line A of FIG. 7 illustrates a simple read operation, without purging. Before the operation, the same bit value is stored in Both M and S. Upon the occurrence of the first clock pulse, data is made available for reading from the master flip-flop M. There is no shifting of data, and both M and S remain in the same condition after the read.

Lines B and C of FIG. 7 show a last-read operation. Upon occurrence of the first clock pulse, data can be read from M, and data is copied into S from the M flip-flop of the next highest numbered word. On the second clock pulse, S is copied into M, leaving both M and S with the contents of what was previously in the corresponding bit location in the next highest numbered word. Lines D and E show what happens in higher numbered word locations during a last-read operation. There is no read from M, but the purge operation is the same as is shown in line C. At the end of the operation, both M and S contain what was previusly in the next highest numbered word location.

Lines F and G of FIG. 7 illustrate a simple write operation. Upon the occurrence of the first clock pulse, data is written into M from the next lowest numbered location, or from the data input lines 128 if the word-0 location is considered. Simultaneously, the contents of S are transferred to the M flip-flop of the next highest numbered word. On the second clock pulse, M is copied into S.

Lines H and I of FIG. 7 show what happens during a simultaneous read and write to the same word. The protocol chosen is that the write will occur first, since this will allow the circuit to be used in a "straight through" manner, without any storage delay. On the first clock pulse, data is copied into M from the next lowest word location, or from the data input lines for the word-0 location, and is immediately made available for reading from M. On the second clock pulse, M is copied into S, to leave both M and S with the same stored value.

Finally, a simultaneous last-read and write are shown in lines J and K. The first phase is the same as that for a simultaneous write and read (without purge). Data is copied into M from the next lowest numbered word, or from the data input lines 128, and is available for reading from M. On the second clock pulse, S is copied back into M, leaving M and S in the same state they were in at the start of the operation. For the word from which the read is made, new data from the word below is stored, read, and immediately purged. For higher numbered words involved in the same operation, new data would be copied into M from the word below on the first clock pulse, and would be erased as S is copied into M an the second clock pulse. Since these higher numbered locates are left unchanged at completion of a simultaneous last-read and write operation, the simplest apporoach is to take no action when a write-enable signal and a purge signal are recognized together, without a read-enable signal.

As shown in FIG. 6, each M and S flip-flop is an R-S flip-flop comprising two cross-connected NOR gates. More specifically, flip-flop M has NOR gates 130 and 132, and S has NOR gates 134 and 136. Flip-flop M has two alternate differential inputs, one from the next lowest numbered word, and the other from the output of the M flip-flop of this same storage element. Similarly, S has two alternate differential inputs, one from the next highest numbered word, and the other from the M flip-flop of this same storage element. The inputs to M are controlled by two pairs of AND gates 138–141 and two OR gates 142 and 143. The inputs to S are likewise controlled by two pairs of AND gates 144–147 and two OR gates 148 and 149.

Differential signals from the word location "below" are applied to AND gates 138 and 140, and the outputs from S are applied to AND gates 139 and 141, as well as to the next highest numbered M inputs. The outputs of AND gates 138 and 139 are applied as inputs to OR gate 142, which supplies the R input of flip-flop M. The outputs of AND gates 140 and 141 are applied as inputs to OR gate 143, which supplies the S input of flip-flop M.

The outputs of flip-flop M are applied to AND gates 145 and 146, and inputs from the next highest word are applied to AND gates 144 and 147. The outputs of AND gates 144 and 145 and OR'd in gate 148 and applied as the R input of flip-flop S, while the outputs of AND gates 146 and 147 are OR'd in gate 149 and applied as the S input of flip-flop S.

Control of this logic in FIG. 6 is effected by four logical combinations of control signals derived from the memory stack control logic 118 (FIG. 4). The four control signals are $P_i.\phi_2$ connected over line 150 to AND gates 139 and 141, WE.$\phi_1$ connected over line 151 to AND gates 138 and 140, WE.$\overline{P}_i.\phi_2$ connected over line 152 to AND gates 145 and 146, and $\overline{WE}.P_i.\phi_1$ connected over line 153 to AND gates 144 and 146. In each instance, the dot symbol (.) represents a logical AND operation. The only other control signal used in the storage element is the read signal, which is applied to AND gate 154, to enable reading data from flip-flop M the output of which is also connected to AND gate 154. The output of AND gate 154 is connected to one bit position of the output bus 122.

Inspection of the FIG. 6 circuitry will confirm that it performs as described in relation to the examples of FIG. 7. For a write operation, control line 151 will be active during the first clock signal, and data is written into M through AND gates 138 and 140. In the second clock phase, line 152 will be active, and data will be copied from M to S through AND gates 145 and 146. For a simple read operation, none of the four control lines is affected, and only AND gate 154 is enabled to place data on the output bus 122.

For a last-read operation, line 153 will be active in the first clock phase, and AND gates 144 and 147 will be enabled, to clock data into S from the next highest numbered word. In the second clock phase, line 150 will be active, and data will be copied from S to M, to AND gates 139 and 141, WE.$\phi_1$ connected over line 151 to AND gates 138 and 140, WE.$\overline{P}_i.\phi_2$ connected over line 152 to AND gates 145 and 146, and $\overline{WE}.P_i.\phi_1$ connected over line 153 to AND gates 144 and 146. In each instance, the dot symbol (.) represents a logical AND operation. The only other control signal used in the storage element is the read signal, which is applied to AND gate 154, to enable reading data from flip-flop M to the output of which is also connected to AND gate 154. The output of AND gate 154 is connected to one bit position of the output bus 122.

Inspection of the FIG. 6 circuitry will confirm that it performs as described in relation to the examples of FIG. 7. For a write operation, control line 151 will be active during the first clock signal, and data is written into M through AND gates 138 and 140. In the second clock phase, line 152 will be active, and data will be copied from M to S through AND gates 145 and 146. For a simple read operation, none of the four control lines is affected, and only AND gate 154 is enabled to place data on the output bus 122.

For a last-read operation, line 153 will be active in the first clock phase, and AND gates 144 and 147 will be enabled, to clock data into S from the next highest numbered word. In the second clock phase, line 150 will be active, and data will be copied from S to M, through AND gates 139 and 141. Similarly, the simultaneous read and write and the simultaneous last-read and write operations function in the same manner as described with respect to the examples in FIG. 7.

Figure 8:
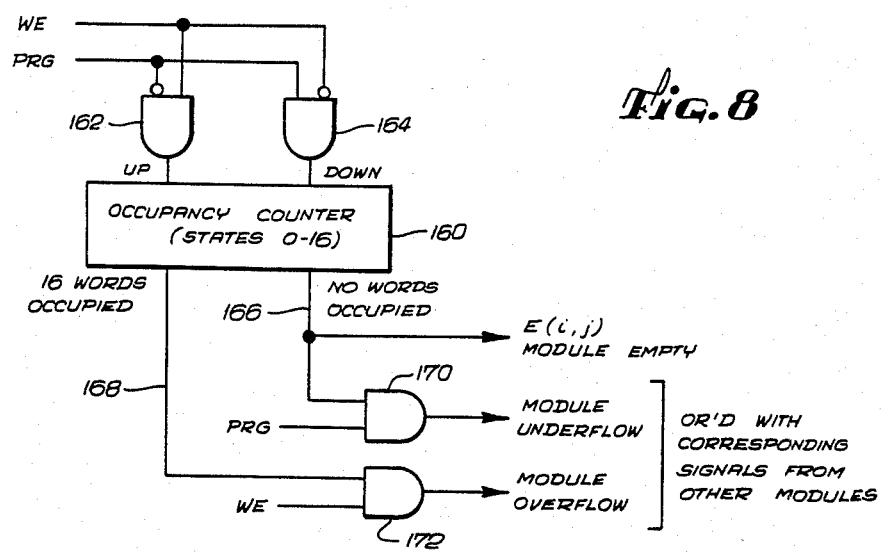
FIG. 8 is a simplified logic diagram showing how an occupancy counter is each storage module may be used to generate module-empty, overflow and underflow signals.

FIG. 8 shows in simplified form how each module provides an indication of its occupancy state. Each module has a sixteen-state occupancy counter 160, which may be a ring counter or an up-down counter, for example. The counter is advanced in one direction on the occurrence of a write-enable signal WE without the simultaneous occurrence of a purge signal PRG. This indicates that a new word of data is being stored without one being purged at the same time. The counter is moved in the other direction on the occurrence of purge signal PRG without the simultaneous presence of a write-enable signal WE. This indicates that the count of stored valid words has been reduced by one. Manipulation of the counter 160 is shown by the connection of the WE and PRG signals through two AND gates 162 and 164, to advance or retard the counter. The counter provides an output signal on line 166 when it regsters a zero word count, and an output on line 168 when it registers a full word count. A separate module-empty signal is provided for each module, and is designated E(i,j).

The module-empty signal on line 166 is AND'd with the PRG signal for the module, in AND gate 170, the result being a module underflow signal that becomes active whenever an attempt is made to purge data from an already empty module. The module underflow signals from all of the modules are OR'd together (not shown) to provide a composite module underflow signal for the entire circuit. Similarly, the module-full signal is AND'd with the write-enable signal WE, in AND gate 172, to provide a module overflow signal whenever an attempt is made to write into an already full module. The module overflow signals for all of the modules are OR'd together (not shown) to provide a composite module overflow signal for the entire circuit.

What has been described up to this point is a two-by-two crossbar switch with a sixteen-word memory capacity at each crosspoint. A circuit of this size can be conveniently fabricated in monolithic form using presently available manufacturing technologies. The particular processes used for manufacture are, of course, not critical to the present invention. Although a two-by-two crossbar circuit would be a limiting factor in any overall system design, the present invention overcomes this possible drawback by being very well suited for interconnection with similar circuits, to provide a much larger crossbar switch with memory capacity. Such an arrangement is shown by way of example in FIG. 9.

Figure 9:
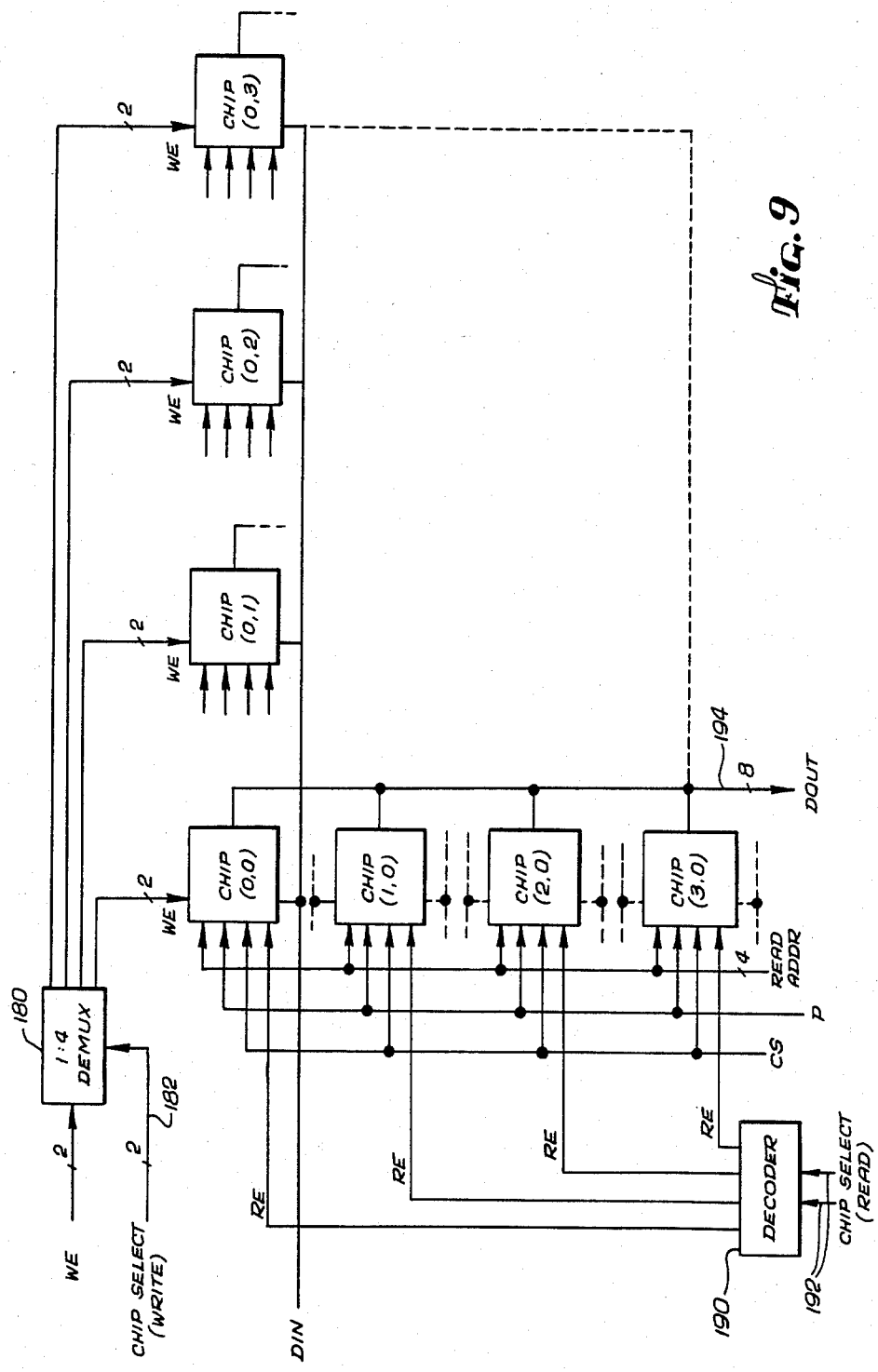
FIG. 9 is a block diagram showing how sixteen two-by-two circuits of the invention may be connected together to form an 8×8 interconnect circuit.

FIG. 9 shows a sixteen two-by-two circuits connected to form an 8×8 crossbar. The two-by-two circuits are referred to in the figure as chips, and designated by their row and column positions (i,j). For clarity, only the row-0 and column-0 chips are shown, and only one input port and one output port are shown, but it will be understood that the other input ports and output ports are similarly connected. The data input signals DIN for each input port are applied in common to all of the chips in a row, but for the write-enable signals some means must be provided for chip selection as well as module selection within a chip. A demultiplexer 180 receives two write-enable signals WE and, in response to a two-bit chip address supplied on lines 182, provides the write-enable signals to the selected chip.

At each output port of the FIG. 9 circuit, the read address signals RA are applied to all chips in the column. Similarly, the module selection signals CS are applied all chips in the column, as is the purge signal P. A decoder 190 is required at each output port to decode chip address signals on lines 192, and to provide a read-enable signal RE to the selected chip. In the configuration shown, there will be two such decoders per chip column, each providing one of four read-enable signals.

The arrangement of FIG. 9 is made possible by the use of tri-state devices, such as those indicated at 96 and 98 in FIG. 2. Since the read-enable signals RE are used to switch the tri-state devices for output, the output lines for one output port can be connected in common. The output lines 194 are connected to the outputs from the same corresponding output port in each chip of the column. Since only one read-enable line is active at a time, the lines 194 are effectively connected to only one output port of one chip in the column.

Although the memory element described above with reference to FIGS. 4 and 6 is the one employed in a presently preferred embodiment of the invention, the random access memory of the invention may take a more generalized form, as shown diagrammatically in FIGS. 10a–10c. FIG. 10a shows by way of example a memory circuit with sixteen locations, numbered 0–15, and having eleven locations holding data, indicated by data words D1–D11. In an initial conditional indicated by FIG. 10a, the data words D1–D11 are stored in locations 0–15, respectively. In the more general form of the memory circuit, a new data word may be written at any selected location, and the effect will be to insert the new data and to move data words on one side of the location at which the insertion is made, by one storage location. For example, FIG. 10b shows the insertion of data word D12 at location #5. Data D6, which was stored in location #5 prior to the write operation, is moved to location #6, and data words D7–D11 are also moved by one location, to locations #7–11, respectively.

FIG. 10c shows a read-and-purge operation from location #3, which contained data word D4. Data words in locations higher in number than location #3 are moved down by one location. Thus D5 is moved into location #3, D12 is moved into location #4, and D6–D11 are moved into locations #5–10, respectively, consolidating the remaining data into a single sequence of continuous locations.

FIGS. 11–13 illustrate how the memory circuit of FIG. 10 operates in response to simultaneous write and read instructions. FIGS. 11a–11c show simultaneous writing and reading with respect to the same memory location, FIGS. 12a–12c show operation of the circuit when the read address is less than the write address, and FIGS. 13a–13c show operation of the circuit when the read address is greater than the write address.

First, for simultaneous writing and reading with respect to the same address in memory, FIG. 11a shows the state of each memory location before the operations. Locations 0–15 contain data A0–A15, respectively, in both the master and the slave cells of each location. In the example, a quantity X is written into memory location i, and a read operation is simultaneously performed on location i. FIG. 11b shows the action that takes place in the first clock cycle. The quantity X is written into the master cell of location i, and is immediately read from the same cell in a read operation. Also in the first cycle, the contents of the slave cell of location i are copied into the master cell of location i+1. Thus location i+1 is left with $A_i$ in its master cell and $A_{i+1}$ in its slave cell. The contents of all slave cells at locations higher than i and likewise copied into the master cells of the next higher locations.

In the second clock cycle, each location numbered i and above has the contents of its slave cell copied into its master cell. This leaves each location in the memory exactly as it was before the simultaneous write and read operations, as shown in FIG. 11c.

FIG. 12a sets up an example in which there is to be a write into location i and a simultaneous read from location j, which lower than location i. In the first clock cycle, as shown in FIG. 12b, a quantity X is written into the master cell of location i, and, as in the previous example, the contents of the slave cell of locations i and higher are copied into the next higher master cell. In the read operation, the quantity $A_j$ is read from the master cell of location j and, for all locations from $j+1$ to i inclusive, the contents of the master cell are copied into slave cell of the next lower location. Thus the j slave cell becomes $A_{j+1}$ the $j+1$ slave cell becomes $A_{j+2}$, and so forth. The $i-1$ slave cell becomes X. In the second clock cycle, the contents of the slave cell of all locations j and higher are copied into the master cells of the next lower locations. Thus, location has $A_{j+1}$ in both cells, location $i-1$ has X in both cells, and locations i and above have their original contents in both cells.

FIG. 13a sets up a third example, in which there is a write to location i and a simultaneous read from location j, but where j is now greater than i. As before, a write of quantity X into location i places X in the master cell of location i, and copies the contents of the slave cell of each cell i and above into the master cell of the next higher location. Thus, the master cell of location i contains $A_{j-1}$, and this is the quantity read by the read operation. In the second clock cycle, the contents of the master cell are copied into the slave cell for each location from zero through location $j-1$, and the contents of the slave cell are copied into the master cell for locations j and above. The result is the insertion of X at location i and the removal of quantity $A_{j-1}$ from the sequence of storage locations.

The storage module and memory cells needed to accomplish these functions are somewhat more complex than those already described, and are shown in detail in FIGS. 14 and 15. The storage module of FIG. 14 is similar in most respects to the embodiment of FIG. 4, and identical reference numerals have been used where appropriate. The major additions in FIG. 14 include a write address decoder 196 and an insert enabling controller 198. The write address decoder 196 operates on the same principles as the read address decoder 114. It receives as input signals a write address WA and a write enable signal WE, together with a $\emptyset_1$ clock signal. An important difference, however, is that the write address decoder also receives as an input an insert control signal INS, which must also be asserted if data is to be inserted into memory. The write address decoder outputs are connected to each of the memory words 0-15, by lines W0 through W15, respectively. Only one of the lines may be asserted at any time, indicating which of the word addresses is to be written into.

One mode of operation of the memory circuit is to arrange for all writing operations to be performed with a write address (WA) that points to the lowest unoccupied location. One way to do this is to employ a counter (not shown) that is incremented after each write operation and decremented after each read-and-purge operation.

The insert enabling controller 198 operates in the same way as the purge enabling controller 116. It receives as inputs the write address lines WA and the insert control signal INS. The output lines are designated $I_0-I_{15}$ and are coupled to the memory stack controls 118. These lines are either asserted (at a logic-one level) or not, depending on the value of WA. Specifically, $I_k$ is asserted only if WA<k.

The memory stack control circuits 118' are slightly more complex than the original control circuits 118 in FIG. 4. The circuits 118' have to decode not only the purge control signals $P_i$ but also the insert control signals $I_i$. Each memory stack control circuit produces four composite control signals for application to the single-bit memory circuits to be described more fully with respect to FIG. 15.

The memory cell used in the FIG. 14 embodiment is also somewhat more complex than the one shown in FIG. 6, and is shown in more detail in FIG. 15. The two memory circuits are identical in many respects, and identical reference numerals are used where appropriate. The principal difference is that the FIG. 15 circuit has two additional signal lines: a data input line DI and a data input control line $W_i$. These lines allow the memory cell to be written into selectively, rather than merely from an adjacent location, as in the FIG. 6 embodiment.

The FIG. 15 circuit also includes two additional AND gates 200 and 202. AND gate 200 has the data input signal DI as one input and the data input control line Wi as another input. The output of AND gate 200 provides an additional input to OR gate 142, which can therefore provide the R input to flip-flop M when an input data bit is directed to the memory cell by the DI signal and the appropriate Wi signal. The other new AND gate 202 has as one input the inverted form of the DI signal, by means of an inverter 204 to which the DI signal is connected before input to AND gate 202, and has as its other input the control line $W_i$. The output of AND gate 202 is connected as an input to OR gate 143, which supplies the S input to the M flip-flop. Thus, when direct writing to the cell is enabled by the Wi line, the M flip-flop will be either set or reset, depending on the state of the input data signal DI.

Note that the signals on lines 150, 151, 152 and 153 have been redefined as $DSM_i$, $USM_i$, $USS_i$ and $DSS_i$, respectively. These control signals have the following meanings:

$DSM_i$=downward shift into M cell of address i,
$USM_i$=upward shift into M cell of address i,
$USS_i$=upward shift into S cell of address i, and
$DSS_i$=downward shift into S cell of address i.

Before complete Boolean expressions can be set forth, the following additional control logic signals must be defined. It is assumed that k is the address of interest, as defined by a read address (RA) or a write address (WA).

$I_k=1$ if WA<k and INS=1, $I_k$ are both zero otherwise;

$P_k=1$ if RA≤k and PRG=1, $P_k$ are both zero otherwise;

$J_k=1$ if WA=k and INS=1, $J_k$ are both zero otherwise;

$T_k=1$ if WA=k, $T_k$ is zero otherwise.

The following are Boolean expressions for each one of the cf control signals applied to the cells of address k:

$W_k = \emptyset 1 \cdot T_k \cdot WE;$
$USM_k = \emptyset 1 \cdot I_k;$
$USS_k = \emptyset 2 \cdot \bar{P}_k;$
$DSM_k = \emptyset 2 \cdot P_k;$
$DSS_k = \emptyset 1 \cdot \bar{P}_k \cdot \bar{I}_k \cdot \bar{J}_k.$ The circuit logic is specified such that the external write-enable line (WE) must be asserted, with a logic-one level, along with the INS line if an inserting function is desired. It is possible to overwrite a data word with new data, without shifting, by asserting the WE line but not the INS line.

It will be appreciated from the foregoing that the present invention represents a significant advance in the field of random access memory circuits, especially as used in conjunction with parallel processors. In particular, the invention provides a random access memory circuit into which data can be inserted at a selected address and data can be read and optionally purged from a selected address. On insertion of data, data words already stored are moved by one location to vacate the selected address. On purging a data word, remaining data words are shifted by one location to refill the vacated address. It will also be appreciated that, although a specific embodiment of the invention has been described in detail for purposes of illustration, various modifications could be made without departing from the spirit and scope of the invention. Accordingly, the invention is not to be limited except as by the appended claims.

We claim:

1. A random access storage and retrieval circuit, comprising:
   a plurality of storage elements arranged in a logical sequence of storage locations;
   means for inserting input data into a selected storage location and moving previously stored data to vacate the selected location and maintain the stored data in a single continuous sequence of storage locations; and
   means for reading output data from a selected storage location and optionally purging the output data and consolidating the remaining stored data into a single continuous sequence of storage locations.

2. A random access storage and retrieval circuit as set forth in claim 1, wherein:
   said data storage elements are arranged in a sequence numbered 0 through n;
   said means for inserting input data functions to shift data stored in locations i through n−1 to locations i+1 through n, respectively, before insertion into location i; and
   said means for reading output data functions to shift data from locations k+1 through n to locations k through n−1, respectively, after reading from location k.

3. A random access storage and retrieval circuit as set forth in claim 2, wherein:
   said means for inserting input data is operative to write always into location 0.

4. A random access storage and retrieval circuit as set forth in claim 2 wherein:
   said means for inserting input data is operative to write into the lowest-numbered unoccupied location.

5. A random access storage and retrieval circuit as set forth in claim 2 wherein:
   each of said storage elements includes a plurality of single-bit storage cells, each of which has a master flip-flop and a slave flip-flop, containing identical data at the beginning and end of a read or write operation; and
   said circuit performs write and read operations on said master flip-flops, and performs necessary shifting operations under the control of two spaced clock signals, the first of which initiates the shifting of data between master and slave flip-flops of adjacent storage locations, and the second of which initiates the copying of data in an appropriate direction between master and slave flip-flops of the same storage location.

6. A random access storage and retrieval circuit, comprising:
   a plurality of storage elements arranged in a logical sequence of contiguous locations;
   a write control line, to enable a writing operation into said circuit;
   a set of write address lines, to define the location into which data is to be written;
   an insert control line to allow optional insertion of written data into the logical sequence of contiguous locations;
   a read control line, to enable a reading operation from said circuit;
   a set of read address lines, to define the location from which data is to be read;
   a purge control line, to allow optional purging of data read from said circuit;
   data reading means responsive to signals on said read control line and said read address lines, for reading data from the read location specified by said read address lines;
   data purging means, coupled to said data reading means and responsive to signals on said purge control line, for purging data from the specified read location, and consolidating the remaining data into a single region of contiguous locations, by shifting by one location all data stored on a preselected side of the specified read location;
   data writing means responsive to signals on said write control line and said write address lines, for writing new data into a write location specified by said write address lines; and
   data insertion means, coupled to said data writing means and responsive to signals on said insert control line, for preserving previously stored data by first shifting by one location the data in and to a preselected side of the specified write location.

7. A random access storage and retrieval circuit as set forth in claim 6, wherein:
   said data storage elements are arranged in a sequence numbered 0 through n;
   said data insertion means functions to shift data stored in locations i through n−1 to locations i+1 through n, respectively, before insertion into location i as called for by said write address lines; and
   said data purging means functions to shift data from locations k+1 through n to locations k through n−1, respectively, after reading from location k as called for by said read address lines.

8. A random access storage and retrieval circuit as set forth in claim 7, wherein:
   said data writing means is operative to write always into location 0.

9. A random access storage and retrieval circuit as set forth in claim 7, wherein:
   said data writing means is operative to write into the lowest-numbered unoccupied location.

10. A random access storage and retrieval circuit as set forth in claim 7, wherein:
   each of said storage elements includes a plurality of single-bit storage cells, each of which has a master flip-flop and a slave flip-flop, containing identical data at the beginning and end of a read or write operation; and said circuit performs write and read operations on said master flip-flops, and performs necessary shifting operations under the control of two spaced clock signals, the first of which initiates the shifting of data between master and slave flip-flops of adjacent storage locations, and the second of which initiates the copying of data in an appropriate direction between master and slave flip-flops of the same storage location.

11. A random access storage and retrieval circuit, comprising:
- a plurality of storage elements arranged in a logical sequence of contiguous locations numbered from 0 through n;
- a write control line, to enable a writing operation into said circuit;
- a set of write address lines, to define the location WA into which data is to be written;
- an insert control line to allow optional insertion of written data into the logical sequence of contiguous locations;
- a read control line, to enable a reading operation from said circuit;
- a set of read address lines, to define the location RA from which data is to be read;
- a purge control line, to allow optional purging of data read from said circuit;
- data reading means responsive to signals on said read control line and said read address lines, for reading data from the read location RA specified by said read address lines;
- data purging means, coupled to said data reading means and reponsive to signals on said purge control line, for purging data from the specified read location RA, and consolidating the remaining data into a single region of contiguous locations, by shifting down by one location all data stored in and above locations WA+1;
- data writing means responsive to signals on said write control line and said write address lines, for writing new data into the write location WA specified by said write address lines; and
- data insertion means, coupled to said data writing means and responsive to signals on said insert control line, for preserving previously stored data by first shifting up by one location the data stored in and above location WA.

12. A random access storage and retrieval circuit as set forth in claim 11, wherein:
said data writing means is operative to write always into location 0.

13. A random access storage and retrieval circuit as set forth in claim 11, wherein:
said data writing means is operative to write into the lowest-numbered unoccupied location.

14. A random access storage and retrieval circuit as set forth in claim 11, wherein:
each of said storage elements includes a plurality of single-bit storage cells, each of which has a master flip-flop and a slave flip-flop, containing identical data at the beginning and end of a read or write operation; and
said circuit performs write and read operations on said master flip-flops, and performs necessary shifting operations under the control of two spaced clock signals, the first of which initiates the shifting of data between master and slave flip-flops of adjacent storage locations, and the second of which initiates the copying of data in an appropriate direction between master and slave flip-flops of the same storage location.

15. For use in a computer with multiple processors, a random access storage and retrieval circuit, comprising:
- a plurality of storage elements arranged in a logical sequence of storage locations;
- means for inserting input data into a selected storage location and moving previously stored data to vacate the selected location and maintain the stored data in a single continuous sequence of storage locations; and
- means for reading output data from a selected storage location and optionally purging the output data and consolidating the remaining stored data into a single continuous sequence of storage locations.

16. A random access storage and retrieval circuit as set forth in claim 15, wherein:
said data storage elements are arranged in a sequence numbered 0 through n;
said means for inserting input data functions to shift data stored in locations i through n−1 to locations i+1 through n, respectively, before insertion into location i; and
said means for reading output data functions to shift data from locations k+1 through n to locations k through n−1, respectively, after reading from location k.

17. A random access storage and retrieval circuit as set forth in claim 16, wherein:
said means for inserting input data is operative to write always into location 0.

18. A random access storage and retrieval circuit as set forth in claim 16, wherein:
said means for inserting input data is operative to write into the lowest-numbered unoccupied location.

19. A random access storage and retrieval circuit as set forth in claim 16, wherein:
each of said storage elements includes a plurality of single-bit storage cells, each of which has a master flip-flop and a slave flip-flop, containing identical data at the beginning and end of a read or write operation; and
said circuit performs write and read operations on said master flip-flops, and performs necessary shifting operations under the control of two spaced clock signals, the first of which initiates the shifting of data between master and slave flip-flops of adjacent storage locations, and the second of which initiates the copying of data in an appropriate direction between master and slave flip-flops of the same storage location.

* * * * *